(12) United States Patent
Sassano et al.

(10) Patent No.: US 10,660,223 B2
(45) Date of Patent: May 19, 2020

(54) ELECTRONICS RACK DOOR ASSEMBLY WITH COLLAPSIBLE ACOUSTICAL PANEL

(71) Applicant: INTERNATIONAL BUSINESS MACHINES CORPORATION, Armonk, NY (US)

(72) Inventors: Camillo Sassano, Durham, NC (US); Steven C. McIntosh, Kingston, NY (US); Kevin L. Schultz, Raleigh, NC (US); John G. Torok, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 263 days.

(21) Appl. No.: 15/906,045

(22) Filed: Feb. 27, 2018

(65) Prior Publication Data

US 2019/0269025 A1    Aug. 29, 2019

(51) Int. Cl.
| | | |
|---|---|---|
| *H05K 7/20* | (2006.01) | |
| *H05K 5/02* | (2006.01) | |
| *H05K 7/14* | (2006.01) | |
| *E06B 5/20* | (2006.01) | |
| *A47B 96/20* | (2006.01) | |

(52) U.S. Cl.
CPC .......... *H05K 5/0213* (2013.01); *A47B 96/20* (2013.01); *E06B 5/20* (2013.01); *H05K 5/0217* (2013.01); *H05K 7/1488* (2013.01); *H05K 7/20736* (2013.01)

(58) Field of Classification Search
CPC .............................. H05K 7/20736; E06B 5/20
See application file for complete search history.

(56) References Cited

U.S. PATENT DOCUMENTS

| | | |
|---|---|---|
| 6,363,993 B1 | 4/2002 | Aquilina |
| 7,178,292 B2 | 2/2007 | Yamada |
| | (Continued) | |

FOREIGN PATENT DOCUMENTS

WO    2013006935 A1    1/2013

OTHER PUBLICATIONS

Chatsworth Products, Inc., "The Effects of Doors on Airflow and Equipment Cooling in IT Equipment Cabinets", www.chatsworth.com, dated 2005 (pp. 4-6, tables 1-2).

*Primary Examiner* — Robert J Hoffberg
(74) *Attorney, Agent, or Firm* — Tihon Poltavets, Esq.; Kevin P. Radigan, Esq.; Heslin Rothenberg Farley & Mesiti P.C.

(57) ABSTRACT

Electronics rack door assemblies are provided to hingedly mount an air inlet or an air outlet side of an electronics rack, and be rotatable between closed and open positions. The door assembly includes a door frame, to hingedly mount to the electronics rack, with an opening to facilitate a flow of air through the electronics rack. The door assembly further includes an acoustical panel pivotably coupled to the door frame and aligned, at least in part, over the opening in the door frame. With the door frame hingedly mounted to the electronics rack at the air inlet or outlet side, the acoustical panel automatically pivots from an operation position relative to the door frame with the door frame in the closed position, to an at least partially collapsed position relative to the door frame with the door frame in the open position.

20 Claims, 12 Drawing Sheets

(56) References Cited

U.S. PATENT DOCUMENTS

| | | | | |
|---|---|---|---|---|
| 7,283,359 B2* | 10/2007 | Bartell | ............... | H05K 7/20736 |
| | | | | 361/695 |
| 7,334,662 B1* | 2/2008 | Anderl | ............... | H05K 7/20009 |
| | | | | 181/200 |
| 7,400,501 B2* | 7/2008 | Bartell | ............... | H05K 7/20736 |
| | | | | 361/695 |
| 7,646,603 B2 | 1/2010 | Bard et al. | | |
| 7,707,711 B2* | 5/2010 | Bartell | ............... | H05K 7/20736 |
| | | | | 181/200 |
| 7,727,059 B2* | 6/2010 | Merino | ................... | G06F 1/181 |
| | | | | 361/695 |
| 8,678,524 B2 | 3/2014 | Green | | |
| 8,701,821 B2* | 4/2014 | O'Coimin | .......... | H05K 7/20736 |
| | | | | 181/224 |
| 8,911,033 B2* | 12/2014 | Li | ........................ | H05K 5/0213 |
| | | | | 312/223.2 |
| 9,326,427 B2* | 4/2016 | Li | ........................ | H05K 5/0213 |
| 9,668,368 B2* | 5/2017 | Cox | ..................... | H05K 5/0217 |
| 9,668,369 B2* | 5/2017 | Cox | ..................... | H05K 5/0217 |
| 9,894,807 B2* | 2/2018 | Bard | ..................... | H05K 7/20736 |
| 10,244,662 B2* | 3/2019 | LaPree | ............... | H05K 7/20736 |
| 2008/0123284 A1 | 5/2008 | Jaramillo et al. | | |
| 2017/0044820 A1 | 2/2017 | Fischer | | |
| 2018/0073294 A1* | 3/2018 | Peng | ........................ | E06B 5/20 |

* cited by examiner

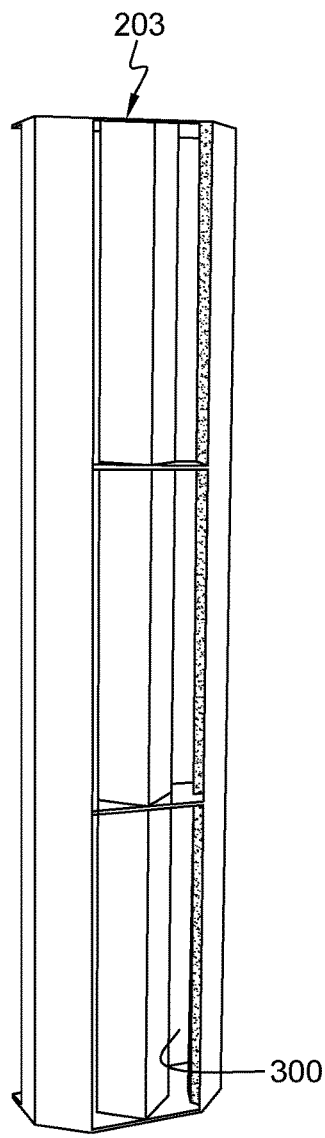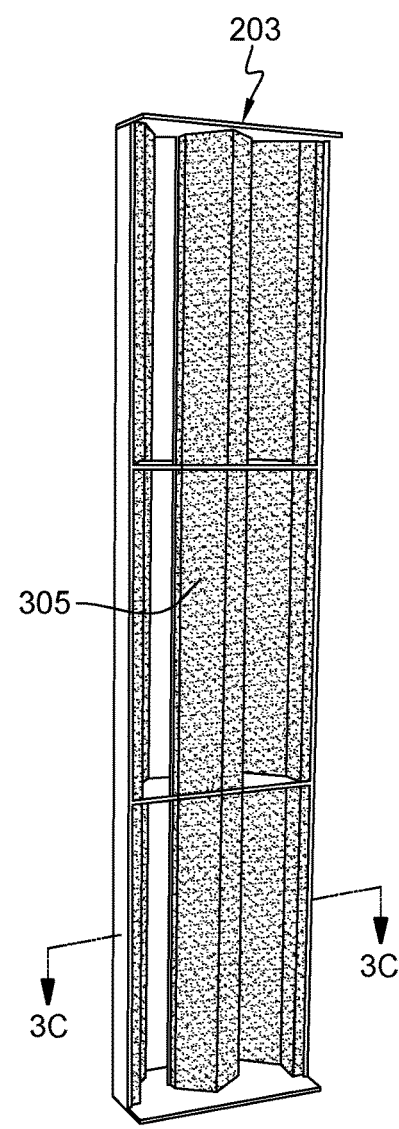
FIG. 3A  FIG. 3B
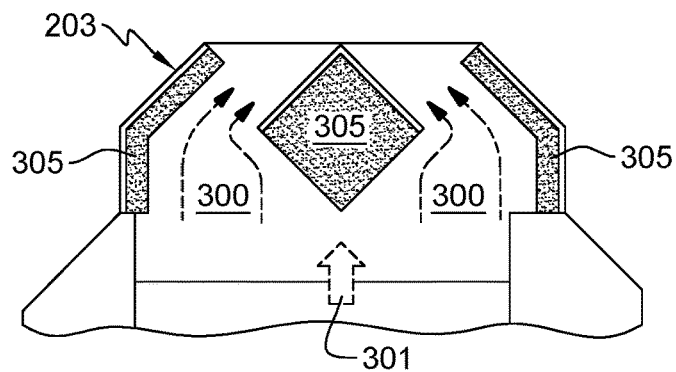
FIG. 3C

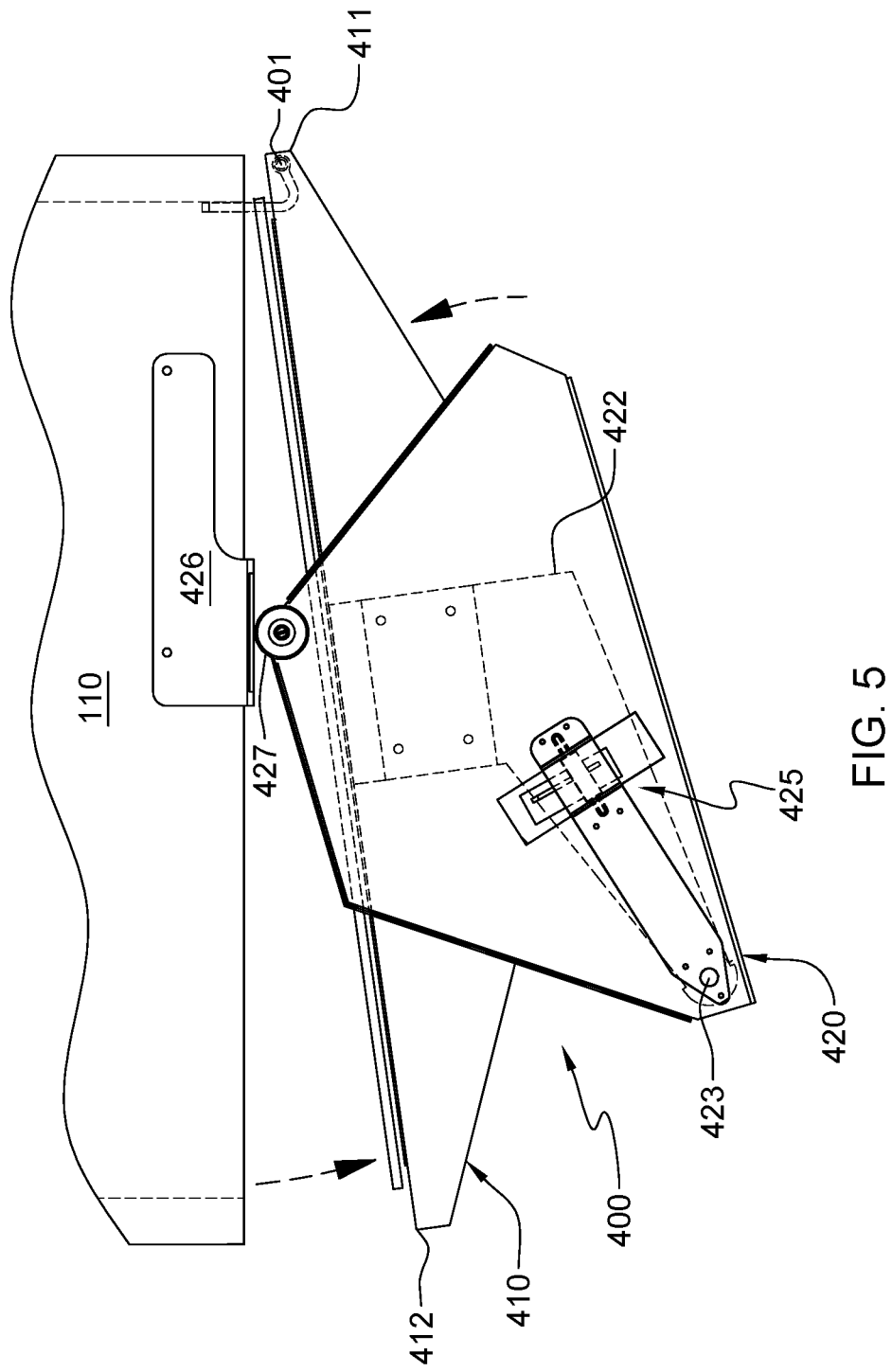

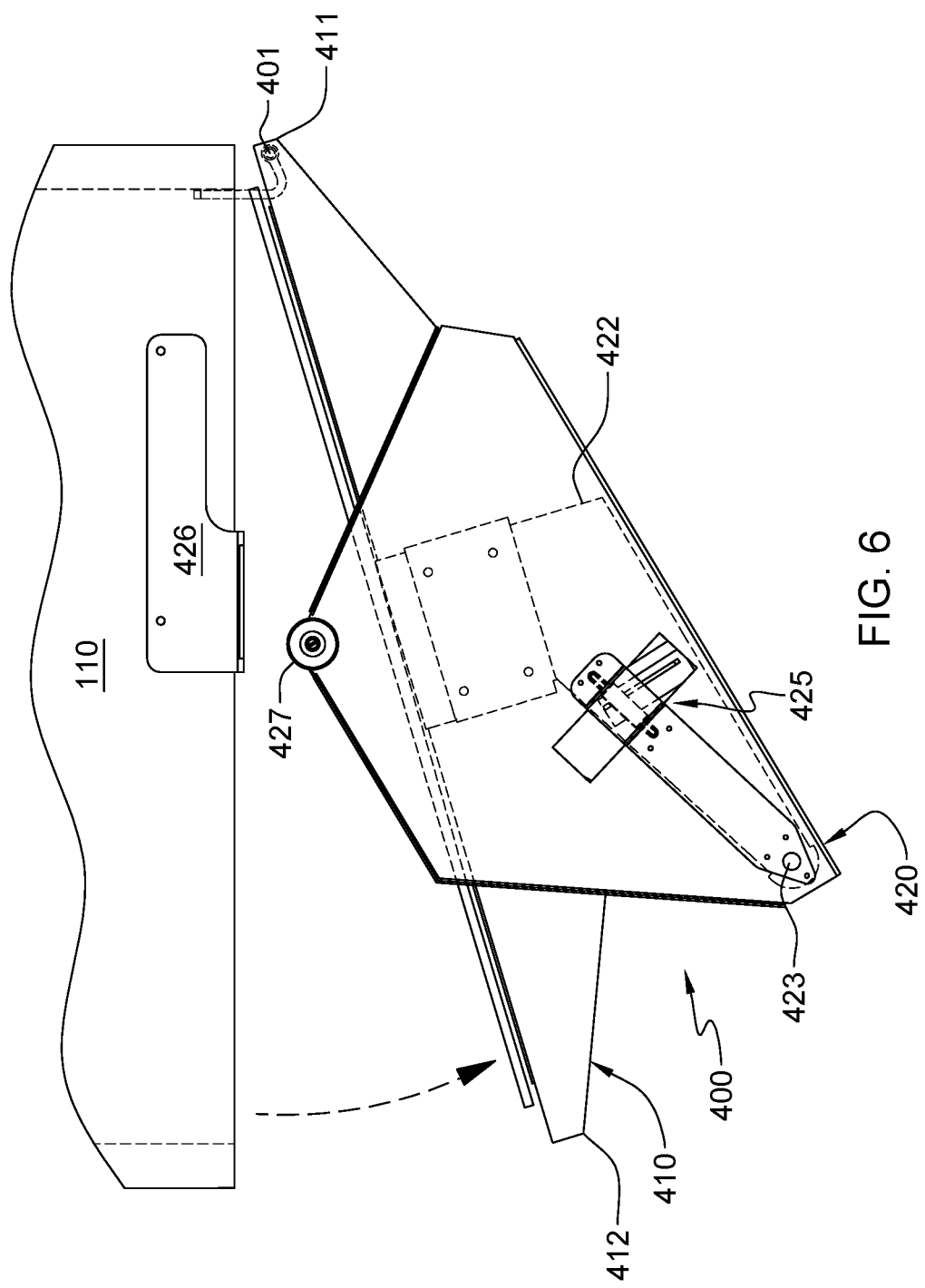

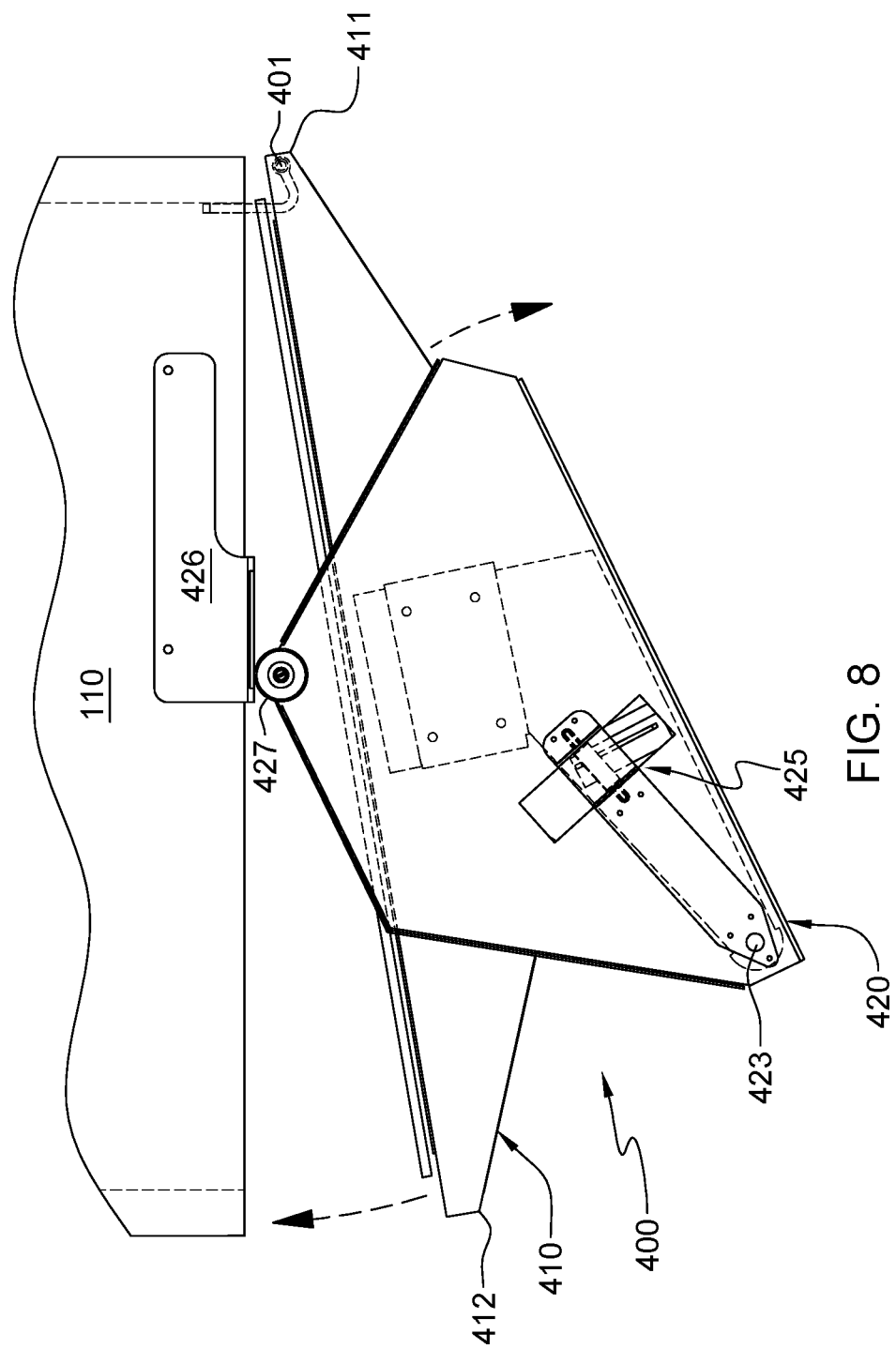

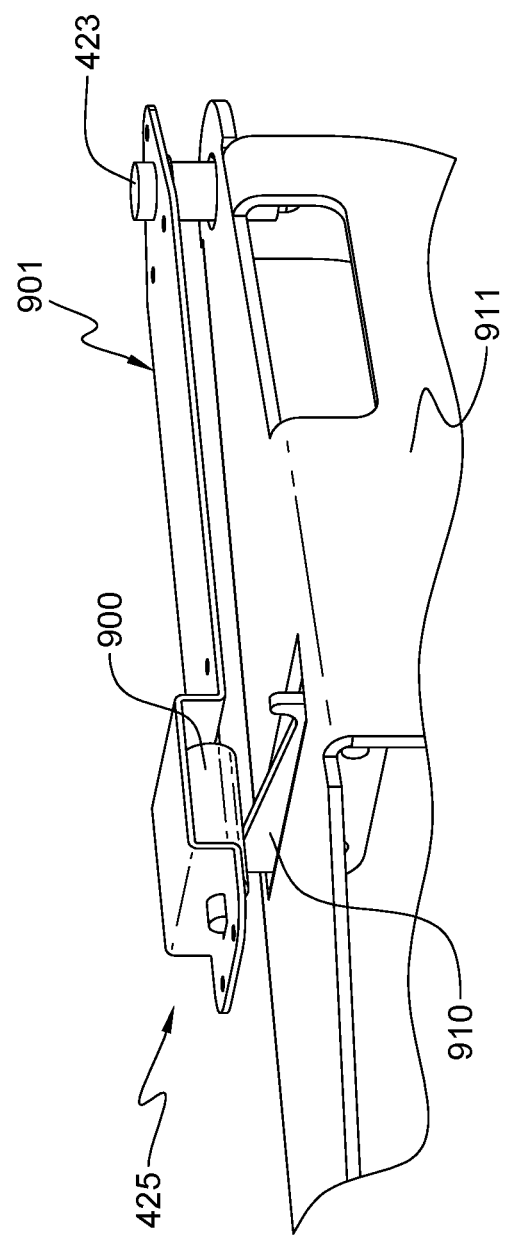

ELECTRONICS RACK DOOR ASSEMBLY WITH COLLAPSIBLE ACOUSTICAL PANEL

BACKGROUND

In many server applications, processors, along with their associated electronics (e.g., memory, disc drives, power supplies, etc.) are packaged in removable drawer or subsystem configurations stacked within an electronics rack or frame, including information technology (IT) equipment. In other cases, the electronics may be in fixed locations within the rack.

As is known, as circuit density of electronic devices continues to increase in order to achieve faster and faster processing speeds, there is corresponding demand for circuit devices to be packed more closely together, and for the circuits themselves to be operated at increasingly higher clock speeds. Each new generation of processors and associated electronics continues to offer increased speed and function. In most cases, this has been accomplished by a combination of increased power dissipation and increased packaging density. The net result has been increased circuit density at all levels of packaging, including at the electronics rack level. This increased packaging density continues to require enhancements to rack-level enclosure designs, and associated structures, as well as to enhanced cooling approaches within a data center.

In many applications, electronics racks may be cooled by air moving in airflow paths, usually front to back, impelled by one or more air-moving devices (e.g., fans or blowers). Typically, increased power dissipation within a rack requires greater airflow through the rack, and thus, the use of more powerful air-moving devices or the use of increased rotational speed (i.e., RPM's) of existing air-moving devices within the rack. As a result of this increasing airflow through an electronics rack, acoustic noise generated by the air-moving devices within the electronics rack(s) can rise to unacceptably high levels.

SUMMARY

Certain shortcomings of the prior art are overcome and additional advantages are provided through the provision, in one or more aspects, of a door assembly for an electronics rack. The door assembly includes a door frame to hingedly mount to the electronics rack. The door frame includes an opening to facilitate a flow of air through the electronics rack when the door frame is hingedly mounted to the electronics rack at one of an air inlet side or an air outlet side of the electronics rack. The door assembly also includes an acoustical panel pivotably coupled to the door frame and aligned, at least in part, over the opening in the door frame. When the door frame is hingedly mounted to the electronics rack at the air inlet side or air outlet side to be rotatable between a closed position and an open position, the acoustical panel automatically pivots from an operational position relative to the door frame with the door frame in the closed position, to an at least partially collapsed position relative to the door frame with the door frame in the open position.

In another aspect, an apparatus is provided which includes an electronics rack and a door assembly coupled to the electronics rack. The electronics rack includes an air inlet side and an air outlet side to facilitate the ingress and egress, respectively, of air through the electronics rack, and the door assembly is coupled to the electronics rack at one of the air inlet side or the air outlet side. The door assembly includes a door frame and an acoustical panel. The door frame is hingedly mounted to the electronics rack at the one of the air inlet side or the air outlet side thereof, and the door frame includes an opening to facilitate a flow of air through the electronics rack. The acoustical panel is pivotably coupled to the door frame and is aligned, at least in part, over the opening of the door frame. The door frame is rotatable between a closed position and an open position, and the acoustical panel automatically pivots from an operational position relative to the door frame with the door frame in the closed position to an at least partially collapsed position relative to the door frame with the door frame in the open position.

In a further aspect, a method is provided which includes providing a door assembly for an electronics rack. Providing the door assembly includes providing a door frame to hingedly mount to the electronics rack, the door frame including an opening to facilitate a flow of air through the electronics rack when the door frame is hingedly mounted to the electronics rack at one of an air inlet side or an air outlet side of the electronics rack. Providing the door assembly further includes pivotably coupling an acoustical panel to the door frame aligned, at least in part, over the opening in the door frame. When the door frame is hingedly mounted to the electronics rack at the one of the air inlet or the air outlet side to be rotatable between a closed position and an open position, the acoustical panel automatically pivots from an operational position relative to the door frame with the door frame in the closed position, to an at least partially collapsed position relative to the door frame in the open position.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 3A-3C depict a more detailed embodiment of the fixed noise-reducing panel attachment for a door assembly depicted in FIGS. 2A-2B;

FIG. 5 is a partial plan view of the electronics rack and door assembly of FIGS. 4A-4D, with the door assembly shown being rotated open from the closed position, and the acoustical panel automatically pivoting towards the at least partially collapsed position, in accordance with one or more aspects of the present invention;

FIG. 6 is a partial plan view of the electronics rack and door assembly of FIG. 5 shown with further opening of the door assembly, and depicting the acoustical panel in the at least partially collapsed position relative to the door frame, in accordance with one or more aspects of the present invention;

FIG. 8 is a partial plan view of the electronics rack and door assembly of FIGS. 4A-7, with the door assembly shown being closed, and depicting automatic pivoting of the acoustical panel from the at least partially collapsed position towards the operational position depicted in FIG. 4B, in accordance with one or more aspects of the present invention; and FIG. 9 is a partial depiction of a floating pivot of the acoustical panel of FIGS. 4A-8, and a biasing mechanism to bias the acoustical panel towards the at least partially collapsed position to facilitate automatic pivoting of the acoustical panel towards the at least partially collapsed position with opening of the door assembly, in accordance with one or more aspects of the present invention.

DETAILED DESCRIPTION

Aspects of the present invention and certain features, advantages and details thereof, are explained more fully below with reference to the non-limiting example(s) illustrated in the accompanying drawings. Descriptions of well-known materials, systems, devices, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note also that reference is made below to the drawings, where the same reference numbers used throughout different figures designate the same or similar components. Numerous inventive aspects and features are disclosed herein, and unless inconsistent, each disclosed aspect or feature is combinable with any other disclosed aspect or feature as desired for a particular application of an electronics rack door assembly with a collapsible acoustical panel, in accordance with the present invention.

The terms "electronics rack" and "rack" are used interchangeably herein, and may include (for instance) any frame, housing, compartment, server system, etc., having one or more heat generating components of, for example, a computer system, electronic system, information technology (IT) system, etc. In one embodiment, an electronics rack may include one or more electronic systems or subsystems. An electronic system or subsystem of an electronics rack may be movable or fixed relative to the electronics rack, with the electronic drawers of a multi-drawer rack unit and blades of a blade center system being examples of systems or subsystems of an electronics rack. Further, a data center may be or include, a computer or information technology (IT) installation containing one or more electronics racks. As a specific example, a data center may be an enterprise data center, and include one or more rows of rack-mounted computing units, such as rack-mounted server units.

Figure 1:
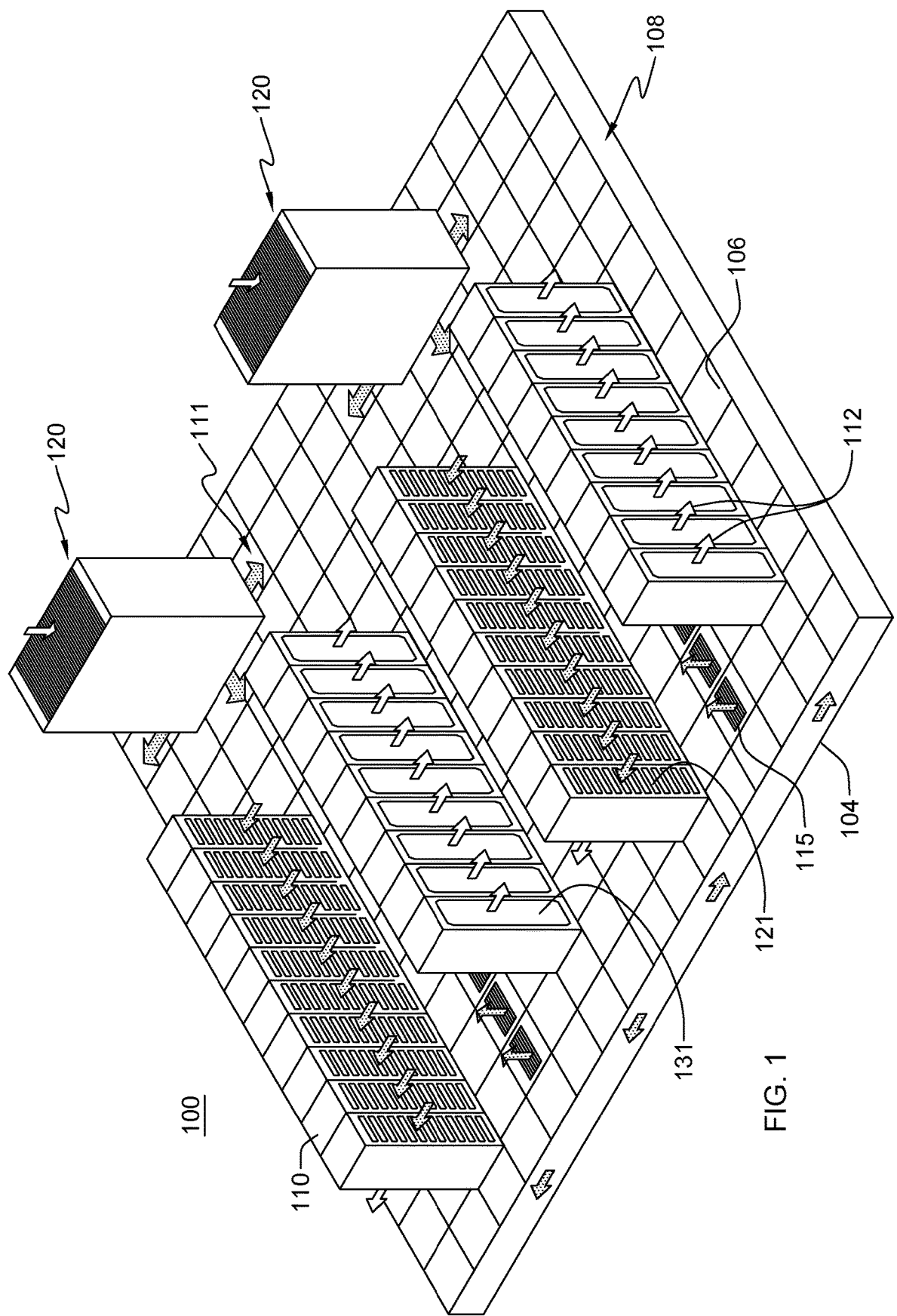
FIG. 1 depicts one embodiment of a data center within which one or more electronics rack door assemblies may be used, in accordance with one or more aspects of the present invention.

FIG. 1 depicts one embodiment of a data center 100, which as one example, may be a raised floor computer installation. In the embodiment shown, data center 100 includes a plurality of electronics racks 110 disposed in rows on a raised floor 106. In operation, one or more computer room air-handling units (CRAHs) 120 (also referred to as computer room air-conditioners (CRACs)) draw in hot air, for example, through one or more air inlet vents in the top of the CRAHs, and exhaust cold air into a sub-floor plenum 108 below raised floor 106. By way of example, hot airflow within data center 100 is depicted by light arrows 112, and cold airflow is indicated by stippled arrows 111.

As shown in FIG. 1, electronics racks 110 may employ (in one example) a front-to-rear cooling approach. Namely, according to this approach, cold air 111 is drawn in through a front (or air-inlet side) 121 of each rack, and hot air 112 is exhausted from a rear (or air-outlet side) 131 of each rack. The cold air drawn into the front of a rack is supplied to air inlets of the electronic components (e.g., servers) disposed within the rack. Sub-floor plenum 108 may serve as a conduit to transport, for example, cold air 111 from air-handling unit(s) 120 to electronics racks 110. In one embodiment, electronics racks 110 may be arranged in a hot aisle/cold aisle configuration, with their air-inlet sides and air-outlet sides disposed in alternating directions, as illustrated in FIG. 1. Cold air 111 may be provided through one or more perforated floor tiles 115 in raised floor 106 from sub-floor plenum 108 into the cold aisles of data center 100. The cold air 111 may then be drawn into electronics racks 110, via their inlets, and subsequently exhausted into the hot aisles of the data center 100 as hot air via outlets of the individual electronics racks 110.

Figure 2B:
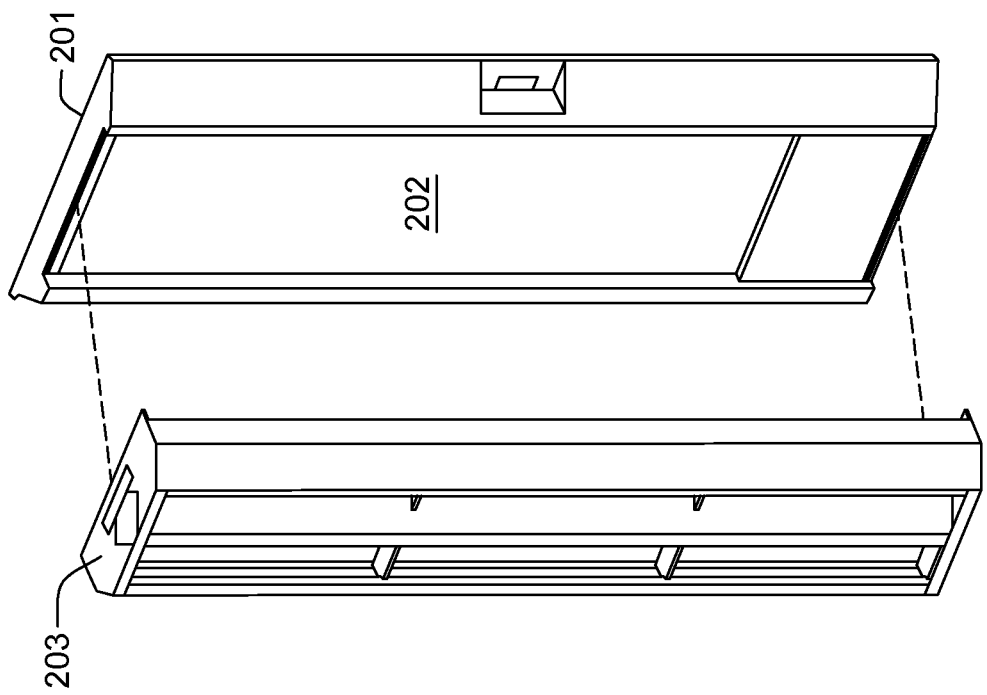
FIGS. 2A-2B depict one embodiment of a door assembly for an electronics rack, where the door assembly includes a fixed noise-reducing panel attachment.
Figure 2A:
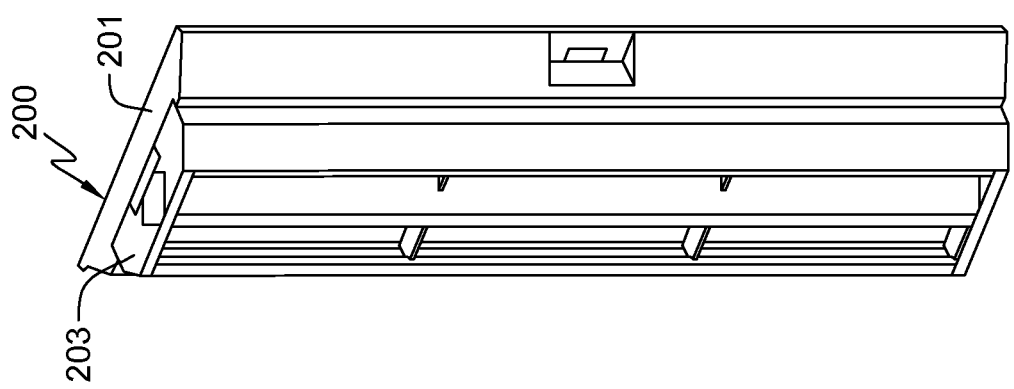

FIGS. 2A & 2B depict one embodiment of a door assembly 200 for an electronics rack. Door assembly 200 is configured to hingedly mount to the electronics rack at one of an air inlet side or an air outlet side of the rack. In the embodiment shown, door assembly 200 includes a door frame 201 with an opening 202 to facilitate or allow for the ingress or egress of a flow of air through the electronics rack when the door assembly is hingedly mounted to the electronics rack at the air inlet or air outlet side of the rack. An acoustical (airflow) panel 203 fixedly mounts to door frame 201 in this example and covers opening 202, with airflow through door assembly 200 passing through panel 203.

FIGS. 3A-3C depict a more detailed embodiment of panel 203 of FIGS. 2A & 2B. As shown, FIG. 3A is an exterior isometric view of acoustical airflow panel 203, FIG. 3B depicts interior surfaces of the acoustical airflow panel, and FIG. 3C is a cross-sectional embodiment of the acoustical airflow panel 203. Acoustical airflow panel 203 includes, in the depicted embodiment, one or more airflow paths 300 to allow an egressing airflow 301 to exit the electronics rack when the door assembly is operatively attached to the rack. As shown, an acoustically absorptive material 305 may be provided over interior surfaces of acoustical airflow panel 203 to attenuate noise from the electronics rack when the door assembly is operatively attached to the rack. In one or more implementations, the acoustically absorptive material may be an acoustical foam (e.g., fiberglass or polyurethane foam). Advantageously, noise energy which otherwise would be free to pass through the door into the data center without attenuation is forced to impinge on the absorptive material and be partially absorb by it. The shapes and angles of surfaces of the acoustical airflow panel may be adjusted to achieve a desired noise reducing effect, while at the same time minimizing pressure drop and airflow impedance through or around the acoustical airflow panel.

For certain data centers, the industry trend is towards increasing the thickness of the acoustical airflow panels and door assemblies on the air inlet and/or air outlet sides of the electronics racks. These thicker door assemblies not only occupy additional floor space, but they can also pose a challenge to opening the door assemblies when there are adjacent electronics racks and/or adjacent door assemblies. As one approach to this issue, the door assembly could be configured with a rotatable pivot to allow a portion of the door to be manually moved out of the way, thereby minimizing impact on an adjacent door or rack with opening of the assembly. For instance, a door assembly could be configured with a rotatable pivot that allows an operator to manually move a portion of the door assembly when opening the door, to minimize potential damage to the door assembly itself or to adjacent covers or door assemblies. However, a manual approach may be prone to operator error, for instance, due to inattentiveness.

Disclosed herein, in one or more aspects, is an acoustical panel (or acoustical airflow panel) layered in front of the door frame. The acoustical panel is hinged to the door frame itself, without contact to, for instance, the electronics rack. When the door assembly is swung open, the acoustical panel disclosed herein automatically pivots to reduce a thickness of the acoustical panel on the door frame pivot side so that, for instance, the door assembly can be opened a full 90° without contacting an adjacent door assembly mounted to a neighboring electronics rack. The acoustical panel couples to the door frame, in one or more implementations, via a floating pivot. Thus, the acoustical panel is a floating panel or floating acoustical airflow panel.

In one or more implementations, the door assembly includes two main elements, a door frame and an acoustical panel (or floating panel). The door frame is configured to hingedly mount to an electronics rack, and includes an opening to facilitate a flow of air through the electronics rack when the door frame is hingedly mounted to the rack at one of an air inlet or air outlet side of the electronics rack. The acoustical panel is pivotably coupled to the door frame and, for instance, aligned, at least in part, over the opening in the door frame (or is disposed to reside, at least in part, within the opening of the door frame). When the door frame is hingedly mounted to the electronics rack at the one of the air inlet side or the air outlet side to be rotatable between a closed position and an open position, the acoustical panel automatically pivots from an operational position relative to the door frame with the door frame in the closed position, to an at least partially collapsed position (in a non-operational position) relative to the door frame with the door frame in the open position.

In one or more implementations, the door frame may include a first vertical edge and a second vertical edge, with the first and second vertical edges being opposite edges of the door frame. The door frame may hingedly mount to the electronics rack at the first vertical edge, and the acoustical panel may include a floating pivot pivotably coupling the acoustical panel to the door frame. By way of example, the floating pivot may be disposed closer to the second vertical edge of the door frame than to the first vertical edge. In one or more embodiments, with opening of the door frame from the closed position to the open position, an edge of the acoustical panel closer to the first vertical edge of the door frame may rotate inward towards the door frame to at least partially collapse the acoustical panel towards the door frame closer to the first vertical edge than the second vertical edge.

The acoustical panel may include an acoustically absorptive material and be configured with airflow pathways to facilitate the ingress or egress of the flow of air through the door assembly when mounted to the electronics rack at one of the air inlet side or air outlet side. The acoustical absorption material may be positioned, at least in part, to attenuate noise emanating from the electronics rack through the opening in the door frame when the door assembly is operably mounted to the electronics rack at the one of the air inlet side or the air outlet side.

Further, in one or more embodiments, a bracket may be provided affixed to the door frame, and the floating pivot may couple the acoustical panel to the bracket. In one or more embodiments, the acoustical panel may include a roller positioned to engage a structure associated with the electronics rack when the door assembly is hingedly mounted to the electronics rack at one of the air inlet or the air outlet side and the door frame is in the closed position. The roller rolls, in part, along the structure with opening of the door frame from the closed position to facilitate automatic pivoting of the acoustical panel relative to the door frame from the operational position to the at least partially collapsed position. By way of example, the structure may be or include a landing bracket that is affixed to the electronics rack. Alternatively, the structure may be a portion of the electronics rack itself, such as a portion of the frame of the electronics rack.

In one or more embodiments, a biasing mechanism may be provided to bias the acoustical panel towards the at least partially collapsed position to facilitate the automatic pivoting of the acoustical panel to the at least partially collapsed position with opening of the door assembly. By way of example, the biasing mechanism may include a biasing roller associated with the acoustical panel and positioned to traverse down a ramp associated with the door frame with opening of the door assembly.

Advantageously, in one or more implementations, the roller, floating pivot and biasing mechanism are positioned and configured to operate as a self-articulating or self-pivoting mechanism within the door assembly, which automatically pivots the acoustical panel in such a way that an edge of the acoustical panel closest to the hinge axis of the door frame is at least partially collapsed against the door frame, thereby minimizing or eliminating inadvertent clashing of the door assembly against an adjacent electronics rack and/or adjacent door assembly by reducing the outward projection of the acoustical panel from the door frame closest to the hinge axis of the door assembly. Further, the self-articulating mechanism operates in reverse to automatically pivot the acoustical panel back to the operational position with closing of the door assembly against the electronics rack. The above-noted aspects and advantages are discussed further below with reference to the apparatus and door assembly embodiments of FIGS. 4A-9.

Figure 4A:
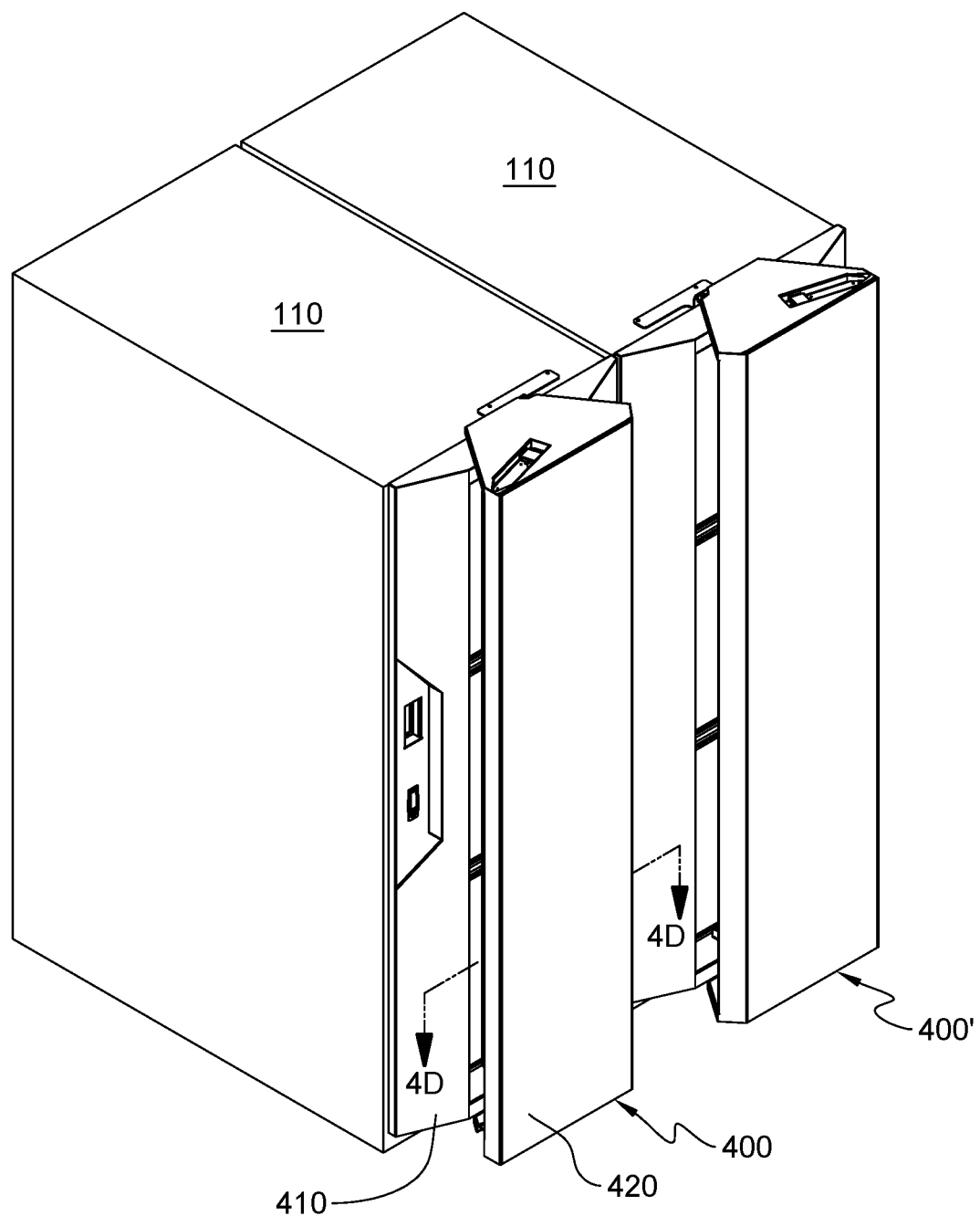
FIG. 4A depicts one embodiment of adjacent electronics racks of a data center, each with a door assembly hingedly mounted thereto having a collapsible acoustical panel, in accordance with one or more aspects of the present invention.

Referring initially to FIG. 4A, two adjacent electronics racks 110 of a data center are illustrated, each with a door assembly 400, 400' hingedly mounted to a respective air inlet or air outlet side of the electronics rack. By way of example, door assemblies, 400, 400' may be mirror images of each other with, for instance, the hinge axis of door assembly 400 being on the right edge of the assembly, and the hinge axis of door assembly 400' being on the left edge of the assembly. Each door assembly 400, 400' includes a respective door frame 410 and acoustical panel 420.

Figure 4B:
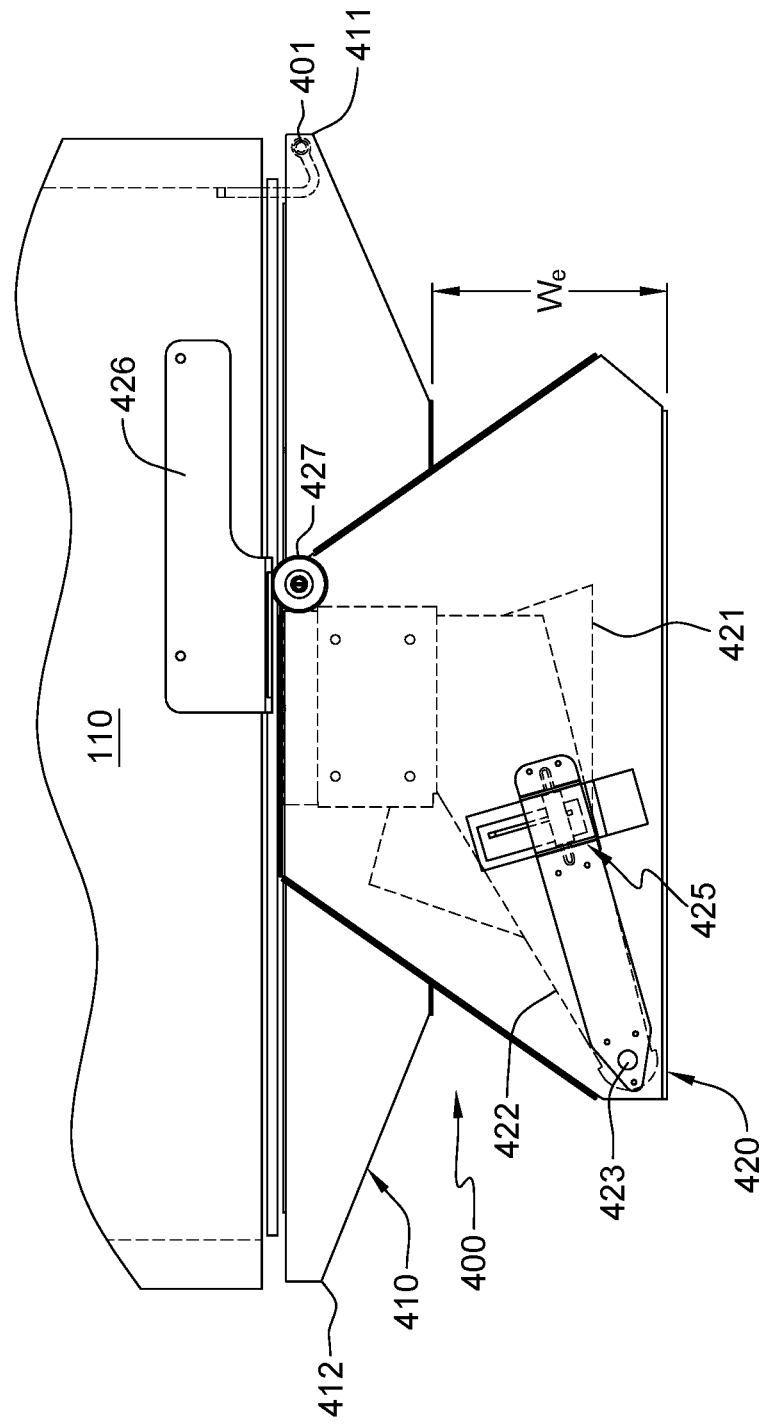
FIG. 4B is a partial plan view of one electronics rack and door assembly of FIG. 4A, with the door assembly shown in closed position and the acoustical panel in operational position, in accordance with one or more aspects of the present invention.
Figure 4C:
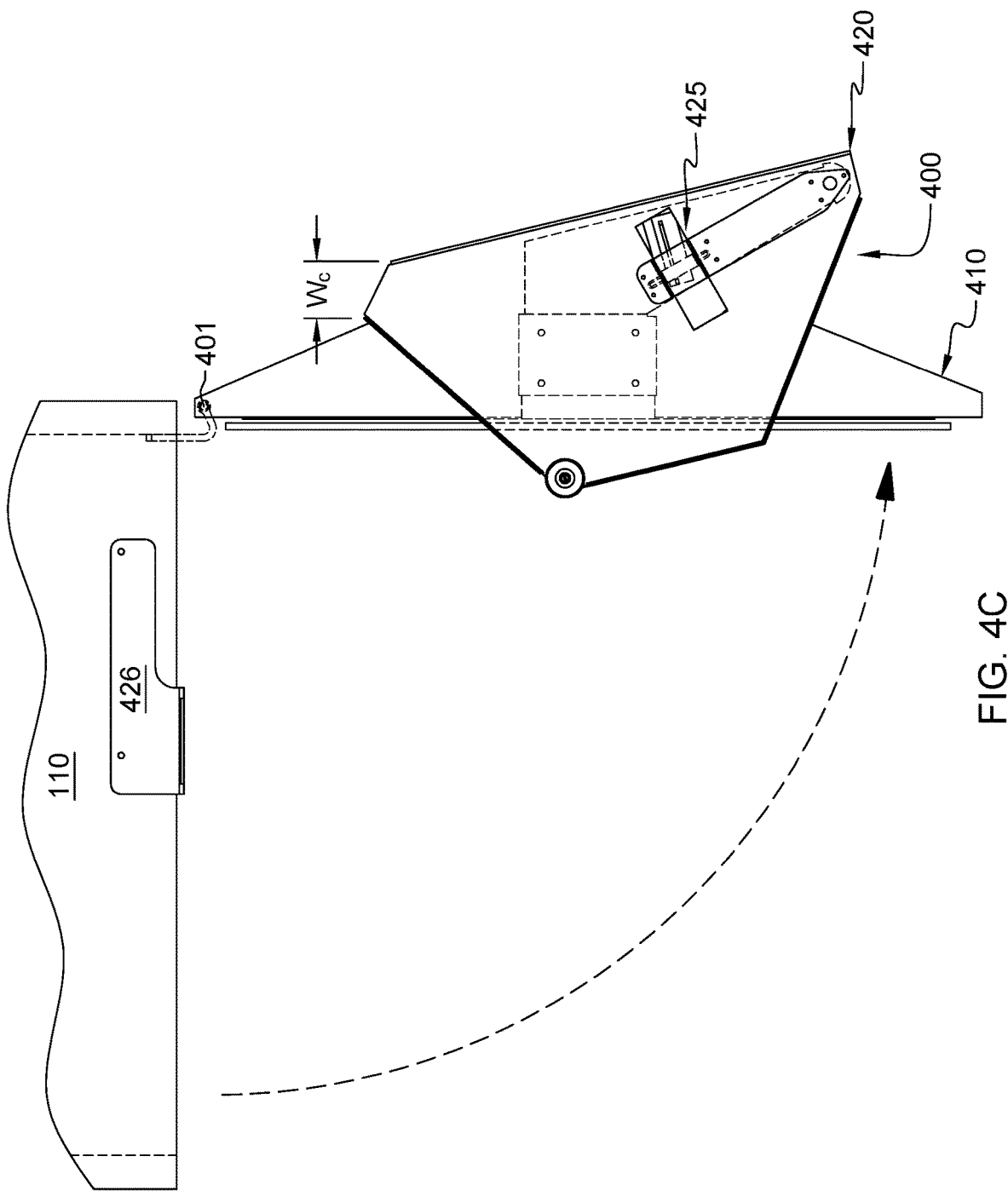
FIG. 4C is a further partial plan view of the electronics rack and door assembly of FIG. 4B, with the door assembly shown in open position, and the acoustical panel in an at least partially collapsed position, in accordance with one or more aspects of the present invention.

FIGS. 4B & 4C depict a more detailed embodiment of door assembly 400 hingedly mounted to electronics rack 110 via one or more hinges 401. In one or more embodiments, door frame 410 includes an opening (such as opening 202 in door frame 201 of door assembly 200 of FIGS. 2A & 2B), and has a first vertical edge 411 and a second vertical edge 412, which are opposite vertical edges of door frame 410. In the embodiment depicted in FIGS. 4B & 4C, door frame 410 is hingedly mounted 401 to electronics rack 110 at first vertical edge 411, along a hinge axis.

Figure 4D:
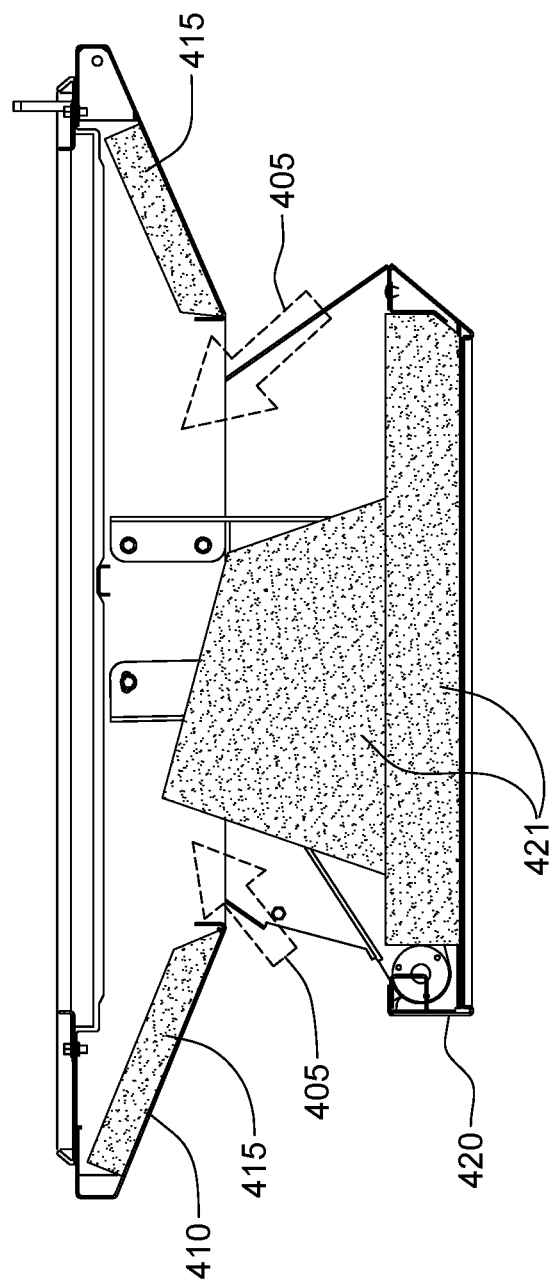
FIG. 4D is a cross-sectional plan view of one embodiment of the door assembly of FIG. 4A, taken along line 4D-4D thereof, in accordance with one or more aspects of the present invention.

Acoustical panel 420 is a floating panel assembly, which includes acoustically absorptive material 421, one embodiment of which is depicted more fully in the cross-sectional embodiment of FIG. 4D. As noted above, the acoustically absorptive material itself, as well as the configuration, shape, size, position, angles of surfaces, may be adjusted to achieve a desired noise reducing effect, while at the same time minimizing a pressure drop and airflow impedance around or through the acoustical (airflow) panel 420. As noted, the industry trend has been towards increasing the size of the acoustical panel resulting, by way of example, in an acoustical panel 420 in the example of FIG. 4B that projects a width $W_e$ outward from door frame 410 when in the operational (or extended) position shown in FIG. 4B.

In the embodiment shown, acoustical panel 420 includes a floating pivot 423 coupling the panel assembly to a bracket 422 affixed (e.g., bolted or otherwise fastened) to door frame 410. In this manner, acoustical panel 420 is a floating panel assembly that is pivotable relative to door frame 410. A roller 427 may be provided within acoustical panel 420 to contact a structure associated with electronics rack 110, such as the frame of the electronics rack, or in the embodiment shown, a landing bracket 426 affixed to a surface of the electronics rack. In the embodiment depicted in FIG. 4A, acoustical panel 420 may be slightly taller than electronics rack 110, and therefore, landing bracket 426 may be affixed to the upper surface of the electronics rack to allow roller 427 to engage the bracket when in the closed, or partially opened position.

In FIG. 4C, door assembly 400 is shown open, for instance, 90° open relative to electronics rack 110, with acoustical panel 420 at least partially collapsed inward towards door frame 410 at an edge closer to first vertical edge 411 with hinge(s) 401 in order to reduce the width $W_c$ of the acoustical panel from the door frame closest to the hinged edge of the door frame.

Further, as depicted in FIGS. 4B & 4C, a biasing mechanism 425 may be associated with acoustical panel 420 to facilitate automatic, self-pivoting of the floating panel relative to the door frame with opening of the door frame from the closed position to the open position, as discussed further below.

As noted, FIG. 4D is a cross-sectional depiction of one embodiment of door assembly 420, showing exemplary acoustically absorptive material 421 of acoustic panel 420, as well as acoustically absorptive material 415 on selected surfaces of door frame 410. As noted, the configuration, shape, size, position, angles of surfaces of the acoustically absorptive material 421, 415 may be adjusted to achieve a desired noise reducing effect, while at the same time minimizing pressure drop and airflow impedance around or through the acoustical panel 420. Also shown in FIG. 4D is an airflow 405 which passes through the opening in door frame 410 and through the acoustical panel 420, with the airflow 405 being shown by way of example only as ingressing airflow into an electronics rack (not shown).

Figure 7:
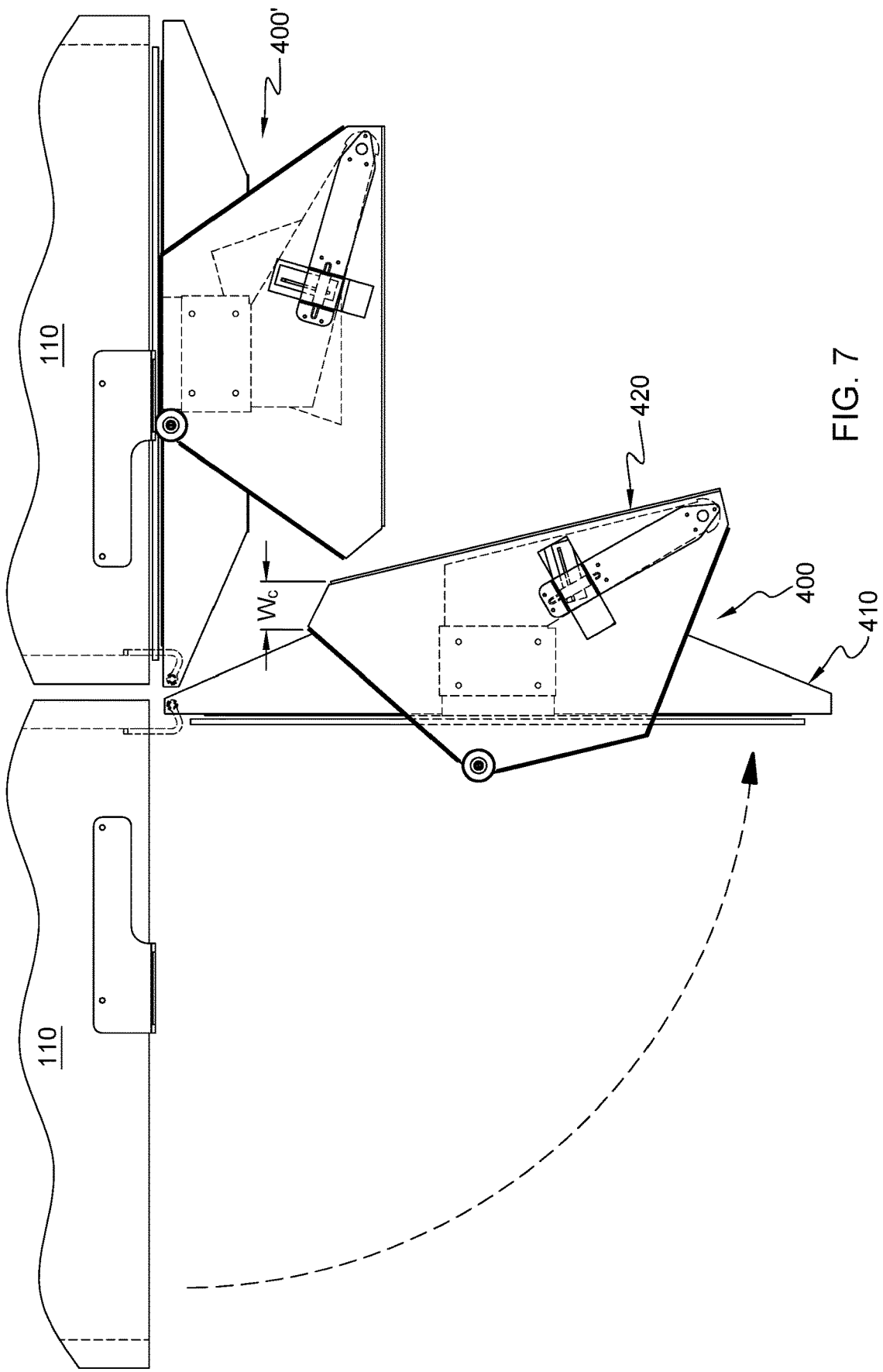
FIG. 7 depicts a partial plan view of two adjacent electronics racks, each having a door assembly such as depicted in FIGS. 4A-6 coupled thereto, and showing one door assembly opened 90°, with its acoustical panel in the at least partially collapsed position, in accordance with one or more aspects of the present invention.

FIGS. 5-7 depict operation of door assembly 400 during opening of the door, and one embodiment of automatic pivoting or self-articulation of acoustical panel 420 relative to door frame 410. As shown in FIG. 5, with a partial opening of door assembly 400 (such as less than 15-20%), roller 427 rolls along a face of landing bracket 426. This action pivots acoustical panel 420 on floating pivot 423 as illustrated, that is, rotates an edge closest to hinge 401 of door assembly 400 inward towards door frame 410. This panel edge is the edge most likely to contact an adjacent door assembly or electronics rack with full opening of door assembly 400 (e.g., to 90° open).

In FIG. 6, door assembly 400 is shown further opened, with roller 427 separated from landing bracket 426 and showing acoustic panel assembly 420 in the at least partially (non-operational) position, with the edge of acoustical panel 420 closest to the hinge axis of the door frame collapsed inward (and the other edge of the acoustical panel extending further outward from the door frame). The automatic pivoting or self-articulation of acoustical panel 420 relative to door frame 410 may be further enhanced by providing a biasing mechanism 425 that, for instance, biases the acoustical panel 420 in the at least partially collapsed position shown in FIG. 6. The biasing mechanism 425 may be used to complete the automatic pivoting of the acoustical panel from its operational position of FIG. 4B to the at least partially collapsed position of FIG. 6.

By way of example, FIG. 9 depicts one embodiment of biasing mechanism 425. As shown, biasing mechanism 425 may include a biasing roller 900 engaging a ramp 910 mounted to a bracket 911 that is affixed to the door frame. In one or more embodiments, biasing roller 900 may be held or constrained by a bracket 901 affixed to floating pivot 423 of the acoustical panel. Thus, rotating of the acoustical panel about floating pivot 423 is facilitated by biasing roller 900 traversing down ramp 910 with opening of the door assembly. In one or more implementations, the extent of rotating of acoustical panel 420 may be by design sufficient to allow opening of the door assembly a specific amount, such as, 90°, without contacting, for instance, a door assembly of an adjacent structure. An example of this is depicted in FIG. 7, where the at least partially collapsed thickness $W_c$ of acoustical panel 420 is such as to provide a space between door assembly 400 when opened 90° and the door assembly 400' of the adjacent electronics rack.

As shown in FIG. 8, when closing door assembly 400, acoustical panel 420 automatically pivots or self-articulates from the at least partially collapsed position shown in FIG. 7 towards the operational position of FIG. 4B. As shown in FIG. 8, with closing of door assembly 400, roller 427 physically contacts and rolls against landing bracket 426 affixed to electronics rack 110 so that as the door assembly continues to be closed, acoustical panel 420 automatically pivots or self-articulates back towards the operational position of FIGS. 4A & 4B. This movement and action also returns biasing mechanism 425 to the initial, biased position depicted, for instance, in FIG. 9. More particularly, as roller 427 rolls along landing bracket 426, and the door continues to close, the biasing roller moves up the ramp, until in the position depicted, for instance, in FIG. 9. Note in this regard that the biasing mechanism could be implemented using different structures. For instance, a spring or any other biasing mechanism could be used to assist in imparting the desired pivoting movement to complete transition of the acoustical panel from the operational position to the at least partially collapsed position with opening of the door assembly.

Those skilled in the art will note from the above description that provided herein is an electronics rack door assembly, or more particularly, a self-articulating rack door assembly, that includes a door frame to cover, for instance, a front or rear opening of an electronics rack. Further, an acoustical panel or floating panel is provided in front of the frame door. A landing bracket may be connected to the top of the electronics rack (e.g., server rack) and the acoustical panel in an operational position may be parallel to the frame door when the door is closed. A self-articulating mechanism is associated with the acoustical panel (or floating panel) to facilitate automatic rotating of the acoustical panel. The mechanism includes a bracket and a floating pivot connecting the acoustical panel to the main door frame. Further, a roller is provided, such as near the top of the acoustical panel, to ride along the landing bracket on the electronics rack when opening or closing the door assembly. While opening the door assembly a few degrees of rotation, the roller rides along the landing bracket and the acoustical panel gradually pivots into the main door frame along an edge closest to the hinge axis of the door frame. After partial rotation, the roller leaves the landing bracket on the electronics rack, and the acoustical panel completes pivoting into the main door frame. In one or more implementations, the door assembly such as disclosed herein may be designed and constructed to be lifted and removed from the electronics rack by a single operator. Further, the door assembly may be fully opened without colliding against the door assembly of an adjacent rack. In one or more embodiments, the acoustical panel may be configured to be removed and reinstalled for shipping or service without the use of tools. The acoustical panel may be floatingly hinged or pivoted on one side and include a self-articulating mechanism to automatically pivot the acoustical panel in such a way that the opposite edge of the acoustical panel collapses inward against the door frame, to thereby minimize or eliminate inadvertent contacting of the door assembly against an adjacent electronics rack and/or door.

Those skilled in the art will note from the discussion provided herein that the embodiment depicted focuses on a single rotational direction of the floating panel, that is, a rotating of the floating panel towards the direction of the door swing. As such, the rotating panel "closes" and presents its "outward" external surface to the adjacent door assembly. As a variation on this embodiment, in one or more implementations, the acoustical panel may pivotably couple to the door frame to pivot in an opposite direction with opening of the door assembly, basically exposing the space between the rotating floating panel and the door frame to the adjacent structure or door assembly as the door opens. Pivoting of the panel assembly in such a manner may be desirable depending upon the particular data center layout within which the electronics rack and associated door assembly are positioned.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A door assembly for an electronics rack, the door assembly comprising:
   a door frame configured to hingedly mount to the electronics rack, the door frame comprising an opening to facilitate a flow of air through the electronics rack when the door frame is hingedly mounted to the electronics rack at one of an air inlet side or an air outlet side of the electronics rack; and
   an acoustical panel pivotably coupled to the door frame and aligned, at least in part, over the opening in the door frame, wherein when the door frame is hingedly mounted to the electronics rack at the one of the air inlet side or the air outlet side to be rotatable between a closed position and an open position, the acoustical panel automatically pivots from an operational position relative to the door frame with the door frame in the closed position, to an at least partially collapsed position relative to the door frame with the door frame in the open position.

2. The door assembly of claim 1, wherein the door frame comprises a first vertical edge and a second vertical edge, the first vertical edge and the second vertical edge being opposite vertical edges of the door frame, the door frame to hingedly mount to the electronics rack at the first vertical edge, and wherein the acoustical panel comprises a floating pivot pivotably coupling the acoustical panel to the door frame, the floating pivot being positioned closer to the second vertical edge of the door frame than the first vertical edge.

3. The door assembly of claim 2, wherein with opening of the door frame from the closed position to the open position, an edge of the acoustical panel closer to the first vertical edge of the door frame rotates inward towards the door frame to at least partially collapse the acoustical panel towards the door frame closer to the first vertical edge than the second vertical edge.

4. The door assembly of claim 2, wherein the acoustical panel further comprises an acoustically absorptive material, the acoustically absorptive material being positioned, at least in part, to attenuate noise emanating from the electronics rack through the opening in the door frame when the door assembly is operatively mounted to the electronics rack at the one of the air inlet side or the air outlet side.

5. The door assembly of claim 2, further comprises a bracket affixed to the door frame, the floating pivot coupling the acoustical panel to the bracket.

6. The door assembly of claim 5, wherein the acoustical panel further comprises a roller to engage a structure associated with the electronics rack when the door assembly is hingedly mounted to the electronics rack at the one of the air inlet side or the air outlet side and the door frame is in the closed position, the roller rolling, in part, along the structure with opening of the door frame from the closed position to facilitate automatic pivoting of the acoustical panel relative to the door frame from the operational position to the at least partially collapsed position.

7. The door assembly of claim 6, wherein the structure comprises a landing bracket affixed to the electronics rack.

8. The door assembly of claim 1, further comprising a biasing mechanism to bias the acoustical panel towards the at least partially collapsed position to facilitate the automatic pivoting of the acoustical panel to the at least partially collapsed position with opening of the door assembly.

9. The door assembly of claim 8, wherein the biasing mechanism comprising a biasing roller associated with the acoustical panel positioned to traverse down a ramp associated with the door frame with opening of the door assembly.

10. An apparatus comprising:
an electronics rack, the electronics rack comprising an air inlet side and an air outlet side to facilitate the ingress and egress, respectively, of air through the electronics rack; and
a door assembly coupled to the electronics rack at one of the air inlet side or the air outlet side, the door assembly comprising:
a door frame hingedly mounted to the electronics rack at the one of the air inlet or the air outlet side thereof, the door frame comprising an opening to facilitate airflow through the electronics rack; and
an acoustical panel pivotably coupled to the door frame and aligned, at least in part, over the opening in the door frame, wherein the door frame is rotatable between a closed position and an open position, and the acoustical panel automatically pivots from an operational position relative to the door frame with the door frame in the closed position to an at least partially collapsed position relative to the door frame with the door frame in the open position.

11. The apparatus of claim 10, wherein the door frame comprises a first vertical edge and a second vertical edge, the first vertical edge and the second vertical edge being opposite vertical edges of the door frame, the door frame being hingedly mounted to the electronics rack at the first vertical edge, and wherein the acoustical panel comprises a floating pivot pivotably coupling the acoustical panel to the door frame, the floating pivot being positioned closer to the second vertical edge of the door frame than to the first vertical edge.

12. The apparatus of claim 11, wherein with opening of the door frame from the closed position to the open position, an edge of the acoustical panel closer to the first vertical edge of the door frame rotates inward towards the door frame to at least partially collapse the acoustical panel towards the door frame closer to the first vertical edge than the second vertical edge.

13. The apparatus of claim 11, wherein the acoustical panel further comprises an acoustically absorptive material, the acoustically absorptive material being positioned, at least in part, to attenuate noise emanating from the electronics rack through the opening in the door frame when the door assembly is operatively mounted to the electronics rack at the one of the air inlet side or the air outlet side.

14. The apparatus of claim 11, further comprising a bracket affixed to the door frame, the floating pivot coupling the acoustical panel to the bracket.

15. The apparatus of claim 14, wherein the acoustical panel further comprises a roller to engage a structure associated with the electronics rack when the door assembly is hingedly mounted to the electronics rack at the one of the air inlet side or the air outlet side and the door frame is in the closed position, the roller rolling, in part, along the structure with opening of the door frame from the closed position to facilitate automatic pivoting of the acoustical panel relative to the door frame from the operational position to the at least partially collapsed positioned.

16. The apparatus of claim 15, wherein the structure comprises a landing bracket affixed to the electronics rack.

17. The apparatus of claim 10, further comprising a biasing mechanism to bias the acoustical panel towards the at least partially collapsed position to facilitate the automatic pivoting of the acoustical panel to the at least partially collapsed position with opening of the door assembly.

18. The apparatus of claim 17, wherein the biasing mechanism comprising a biasing roller associated with the acoustical panel positioned to traverse down a ramp associated with the door frame with opening of the door assembly.

19. A method comprising:
providing a door assembly for an electronics rack, the providing of the door assembly including:
providing a door frame to hingedly mount to the electronics rack, the door frame comprising an opening to facilitate a flow of air through the electronics rack when the door frame is hingedly mounted to the electronics rack at one of an air inlet side or an air outlet side of the electronics rack; and
pivotably coupling an acoustical panel to the door frame to be aligned, at least in part, over the opening of the door frame, wherein when the door frame is hingedly mounted to the electronics rack at the one of the air inlet side or the air outlet side to be rotatable between a closed position and an open position, the acoustical panel automatically pivots from an operation position relative to the door frame with the door frame in the closed position, to an at least partially collapsed position relative to the door frame in the open position.

20. The method of claim 19, wherein providing the door frame comprises providing the door frame with a first vertical edge and a second vertical edge, the first vertical edge and the second vertical edge being opposite vertical edges of the door frame, the door frame to hingedly mount to the electronics rack at the first vertical edge, and wherein the method includes providing the acoustical panel with a floating pivot pivotably coupling the acoustical panel to the door frame, the floating pivot being disposed closer to the second vertical edge of the door frame than the first vertical edge.

* * * * *